(12) United States Patent
Lee et al.

(10) Patent No.: US 7,435,673 B2
(45) Date of Patent: Oct. 14, 2008

(54) METHODS OF FORMING INTEGRATED CIRCUIT DEVICES HAVING METAL INTERCONNECT STRUCTURES THEREIN

(75) Inventors: Kyoung Woo Lee, Fishkill, NY (US); Ja-Hum Ku, LaGrangeville, NY (US); Duk Ho Hong, Fishkill, NY (US); Wan Jae Park, Fishkill, NY (US)

(73) Assignee: Samsung Electronics Co., Ltd. (KR)

( * ) Notice: Subject to any disclaimer, the term of this patent is extended or adjusted under 35 U.S.C. 154(b) by 414 days.

(21) Appl. No.: 11/237,987

(22) Filed: Sep. 28, 2005

(65) Prior Publication Data

US 2007/0072406 A1     Mar. 29, 2007

(51) Int. Cl.
*H01L 21/4763*     (2006.01)
(52) U.S. Cl. ............... 438/596; 438/627; 438/648; 438/633; 438/637; 438/639; 438/672
(58) Field of Classification Search ............... None
See application file for complete search history.

(56) References Cited

U.S. PATENT DOCUMENTS

| | | | | |
|---|---|---|---|---|
| 5,712,207 A | * | 1/1998 | Lee et al. | 438/627 |
| 5,747,379 A | * | 5/1998 | Huang et al. | 438/586 |
| 6,096,631 A | * | 8/2000 | Nakamura et al. | 438/597 |
| 6,191,027 B1 | * | 2/2001 | Omura | 438/627 |
| 6,265,257 B1 | * | 7/2001 | Hsu et al. | 438/215 |
| 6,605,545 B2 | | 8/2003 | Wang | |
| 6,689,695 B1 | | 2/2004 | Lui et al. | |
| 6,831,013 B2 | | 12/2004 | Tsai et al. | |
| 6,910,907 B2 | * | 6/2005 | Layadi et al. | 439/290 |
| 6,939,791 B2 | * | 9/2005 | Geffken et al. | 438/622 |
| 2005/0106919 A1 | * | 5/2005 | Layadi et al. | 439/290 |
| 2005/0224854 A1 | * | 10/2005 | Park | 257/296 |

(Continued)

FOREIGN PATENT DOCUMENTS

JP     2001-007200     1/2001

(Continued)

OTHER PUBLICATIONS

Notice of Examination Report, Korean Application No. 10-2006-0001374, Nov. 15, 2006.

*Primary Examiner*—David E Graybill
(74) *Attorney, Agent, or Firm*—Myers Bigel Sibley & Sajovec

(57) ABSTRACT

Methods of forming metal interconnect structures include forming a first electrically insulating layer on a semiconductor substrate and forming a second electrically insulating layer on the first electrically insulating layer. The second and first electrically insulating layers are selectively etched in sequence to define a contact hole therein. A first metal layer (e.g., tungsten) is deposited. This first metal layer extends on the second electrically insulating layer and into the contact hole. The first metal layer is then patterned to expose the second electrically insulating layer. The second electrically insulating layer is selectively etched for a sufficient duration to expose the first electrically insulating layer and expose a metal plug within the contact hole. This selective etching step is performed using the patterned first metal layer as an etching mask. A seam within the exposed metal plug is then filled with an electrically conductive filler material (e.g., CoWP). A second metal layer is then formed on the exposed metal plug containing the electrically conductive filler material.

16 Claims, 17 Drawing Sheets

U.S. PATENT DOCUMENTS

| | | | |
|---|---|---|---|
| 2006/0128130 A1* | 6/2006 | Jang et al. | 438/589 |
| 2006/0237853 A1* | 10/2006 | Nogami | 257/775 |
| 2007/0007653 A1* | 1/2007 | Chen et al. | 257/751 |
| 2007/0072406 A1* | 3/2007 | Lee et al. | 438/618 |

FOREIGN PATENT DOCUMENTS

| | | |
|---|---|---|
| JP | 2003037162 A | 2/2003 |
| JP | 2003045964 A | 2/2003 |
| JP | 2003234401 A | 8/2003 |
| JP | 2004079901 A | 3/2004 |
| JP | 2004207604 A2 | 7/2004 |
| KR | 10-0324023 | 1/2002 |
| KR | 10-2004-0069786 | 8/2004 |
| KR | 10-2005-0002423 | 1/2005 |
| KR | 10-2005-0009798 | 1/2005 |
| KR | 10-2005-0024853 | 3/2005 |
| KR | 1020050034029 A | 4/2005 |

* cited by examiner

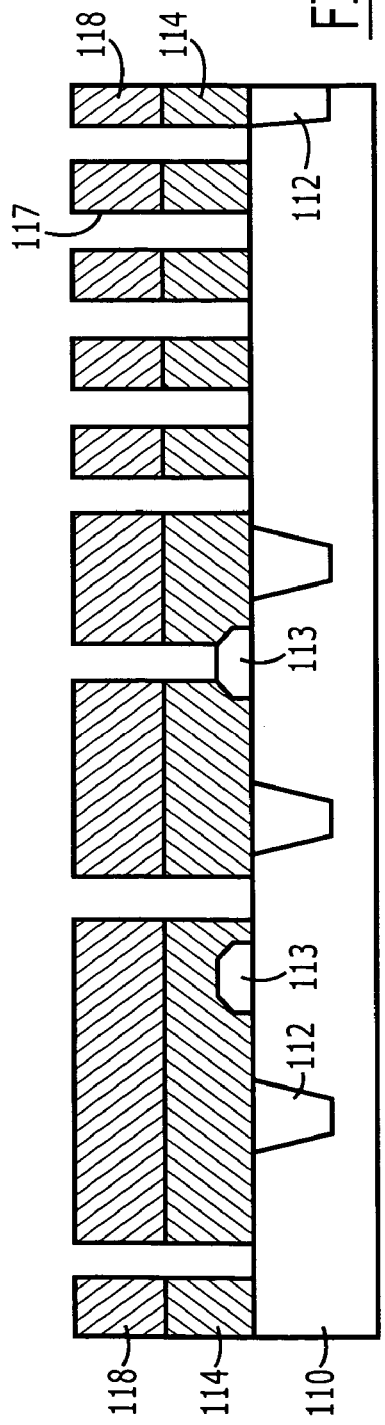
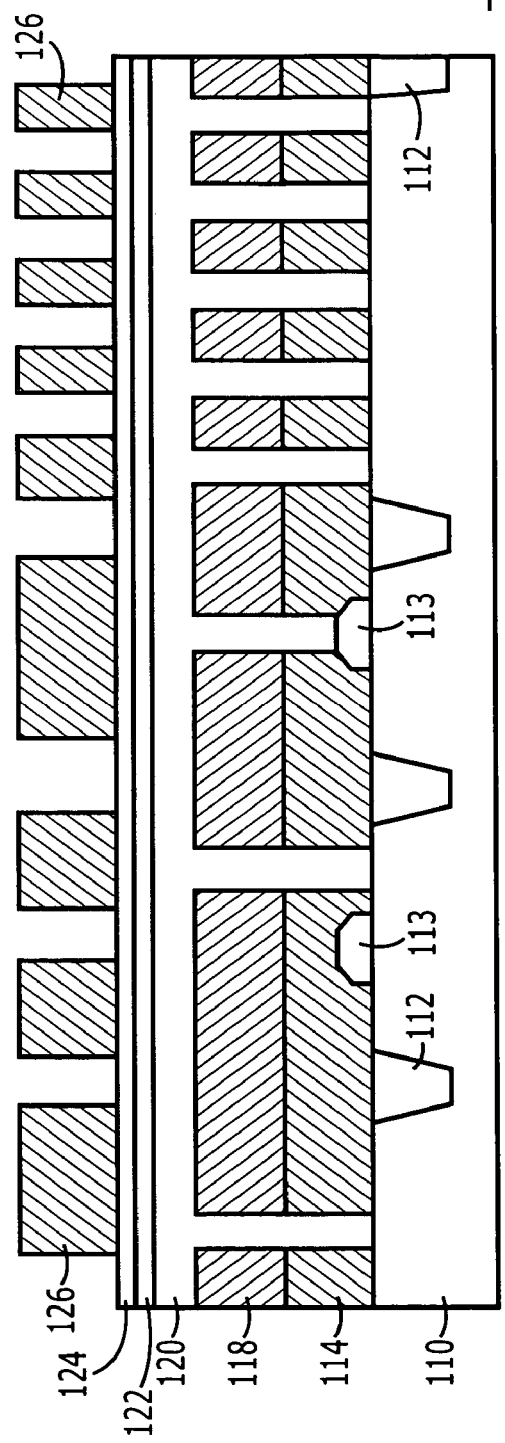

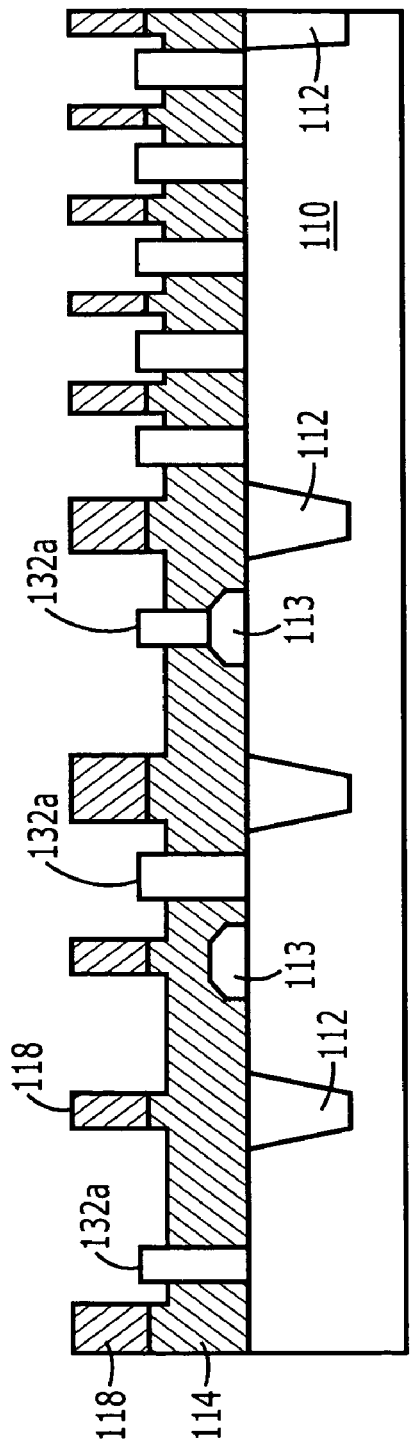
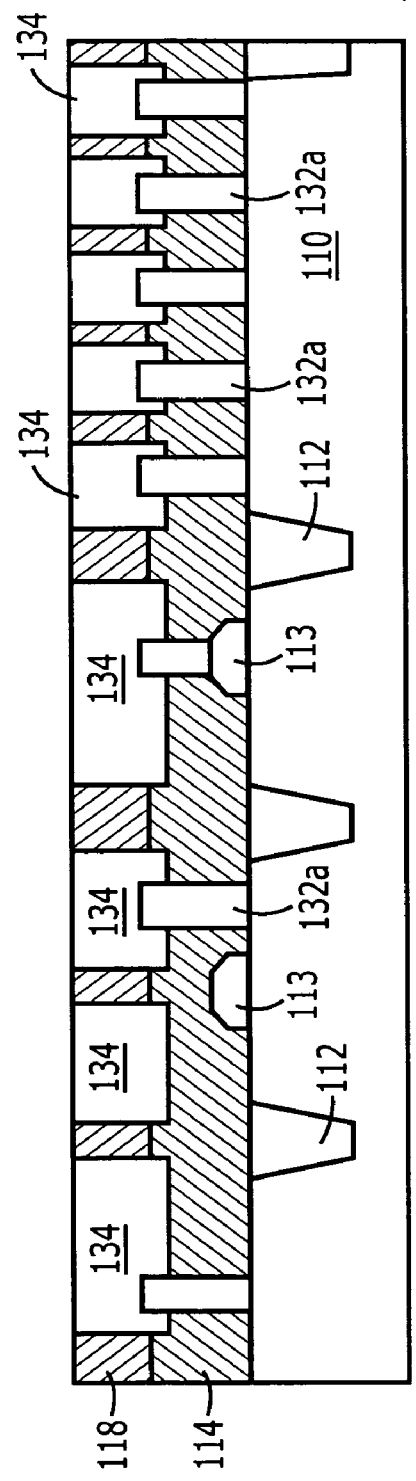
FIG. 3A
FIG. 3B

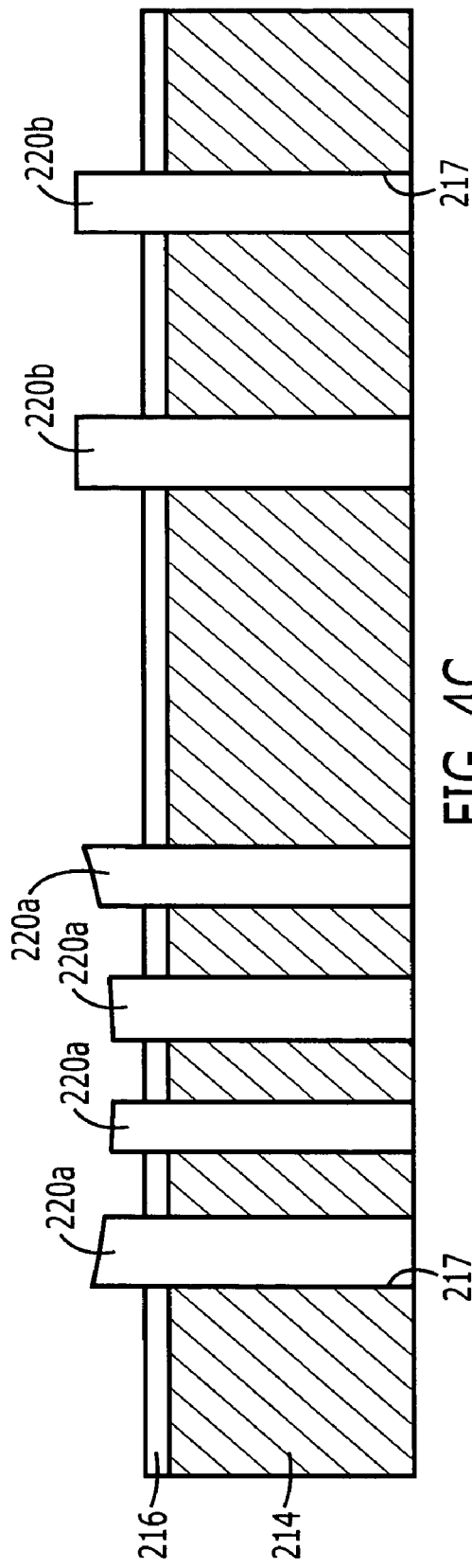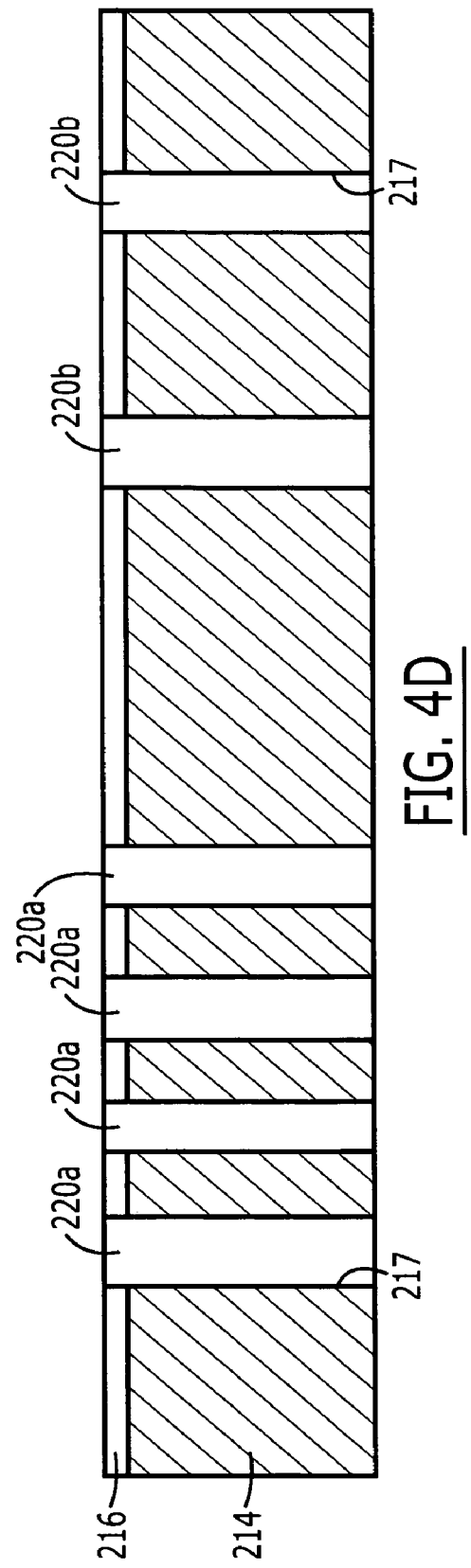

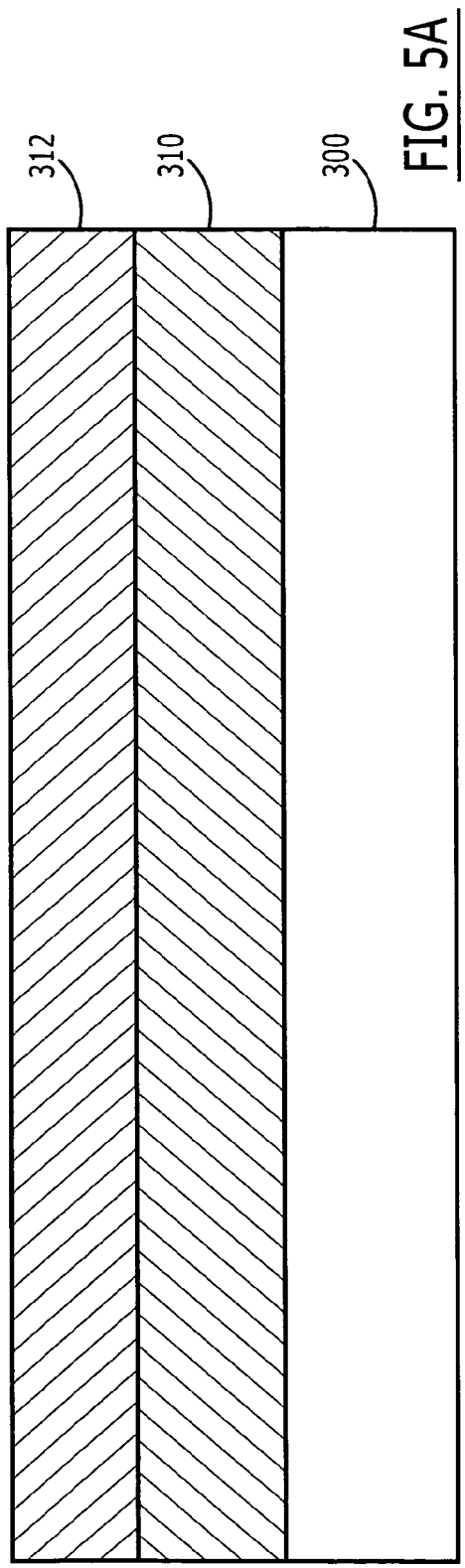
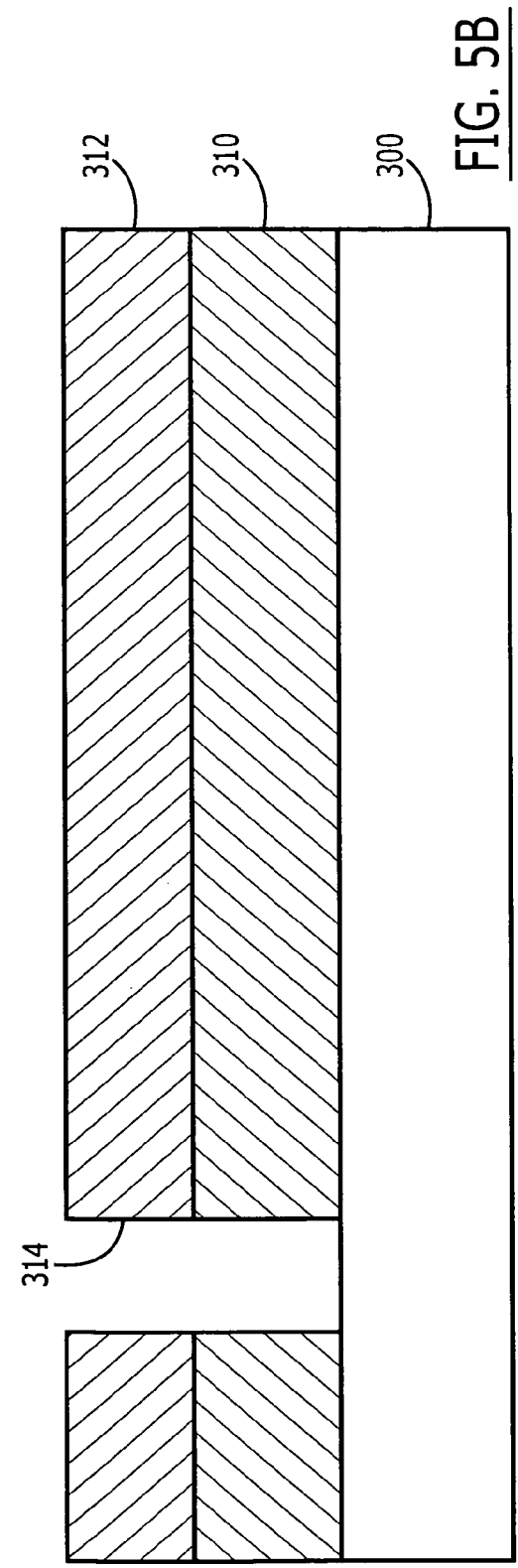

METHODS OF FORMING INTEGRATED CIRCUIT DEVICES HAVING METAL INTERCONNECT STRUCTURES THEREIN

FIELD OF THE INVENTION

The present invention relates to integrated circuit fabrication methods and, more particularly, to methods of fabricating integrated circuit devices having metal interconnect layers therein.

BACKGROUND OF THE INVENTION

Conventional methods of fabricating integrated circuit devices may utilize metal damascene process steps to define multi-layer metal interconnects on a semiconductor substrate. As illustrated by FIGS. 1A-1C, one conventional method may include forming a first electrically insulating layer 14 on a semiconductor substrate 10 having trench isolation regions 12 therein. This first electrically insulating layer 14 may be formed directly on a surface of the substrate 10 in order to provide a degree of passivation for underlying device structures (e.g., gate electrodes 13). The first electrically insulating layer 14 may be photolithographically patterned to define a plurality of contact holes 15 therein. As illustrated, the density of the contact holes 15 may vary with location on the substrate 10. After formation of the contact holes 15, a blanket layer 16 of a first electrically conductive material (e.g., tungsten (W)) may be conformally deposited on the first electrically insulating layer 14.

As illustrated by FIG. 1B, this blanket layer 16 may be planarized for a sufficient duration to expose the first electrically insulating layer 14 and thereby define a first plurality of conductive vias 16a, 16b and 16c. This planarization step may be performed as a conventional chemical-mechanical polishing (CMP) step using a polishing apparatus in combination with a slurry solution that is applied to an upper surface of the blanket layer 16 during polishing. Unfortunately, during polishing, a "dishing" phenomenon may result in an excessive recession of the first electrically insulating layer 14 opposite those portions of the substrate 10 containing a relatively high density of conductive vias 16c. Thereafter, as illustrated by FIG. 1C, a second electrically insulating layer 18 may be deposited on the structure of FIG. 1B and then patterned to define openings therein that are aligned with the conductive vias 16a, 16b and 16c. Next, a blanket layer of a second electrically conductive material (e.g., copper (Cu) or tungsten (W)) may be conformally deposited on the second electrically insulating layer 18. This blanket layer may then be planarized using CMP to define a second plurality of metal lines 20a, 20b, 20c and 20d. Unfortunately, because of the excessive recession of the first electrically insulating layer 14 illustrated by FIG. 1B, the planarization of the second electrically conductive material may result in the formation of a relatively wide metal line 20d that electrically shorts adjacent conductive vias 16c together. This relatively wide metal line 20d represents a metal defect (e.g., metal line short) that may significantly reduce device yield after back-end processing steps have been completed.

SUMMARY OF THE INVENTION

Embodiments of the invention include methods of forming integrated circuit devices using metal damascene process steps. According to some of these embodiments, the methods are provided by forming an electrically insulating layer having a contact hole therein, on a semiconductor substrate and then forming a recess in the electrically insulating layer, at a location adjacent the contact hole. The contact hole and the recess are then filled with a first electrically conductive material (e.g., tungsten (W)). At least a portion of the first electrically conductive material within the contact hole is then exposed. This exposure occurs by etching back a portion of the electrically insulating layer using the first electrically conductive material within the contact hole and within the recess as an etching mask. The first electrically conductive material within the recess is then removed to expose another portion of the electrically insulating layer. Following this, the exposed portion of the first electrically conductive material is covered with a second electrically conductive material (e.g., copper (Cu)), which directly contacts the exposed portion of the first electrically conductive material. This covering step results in the definition of a wiring pattern including the first and second electrically conductive materials. In particular, the covering step may include depositing a layer of metallization directly on the exposed portion of the first electrically conductive material and then planarizing the deposited layer of metallization for a sufficient duration to expose the electrically insulating layer.

According to further aspects of these embodiments, the step of forming a recess in the electrically insulating layer may include etching the recess into the electrically insulating layer using a photolithographically patterned layer as an etching mask. In this case, the step of etching the recess may be preceded by a step of depositing a spin-on-glass layer into the contact hole and onto the electrically insulating layer. This step of depositing a spin-on-glass layer is followed by the steps of depositing an anti-reflecting coating on the spin-on-glass layer and depositing a photoresist layer on the anti-reflective coating. This step of depositing a photoresist layer may then be followed by the steps of patterning the photoresist layer and etching the spin-on-glass layer using the patterned photoresist layer as an etching mask.

According to further embodiments of the invention, methods of forming integrated circuit devices using metal damascene process steps forming an electrically insulating layer having a contact hole therein, on a semiconductor substrate and then forming a recess in the electrically insulating layer, at a location adjacent the contact hole. The contact hole and the recess are then filled with a first electrically conductive material (e.g., tungsten (W)). At least a portion of the first electrically conductive material within the contact hole is then exposed. This exposure occurs by etching back a portion of the electrically insulating layer using the first electrically conductive material within the contact hole and within the recess as an etching mask. The first electrically conductive material within the recess is then removed to expose another portion of the electrically insulating layer. Following this, the exposed portion of the first electrically conductive material and the first electrically conductive material within the recess is covered with a second electrically conductive material (e.g., copper (Cu)), which directly contacts the exposed portion of the first electrically conductive material. The second electrically conductive material is then planarized for a sufficient duration to remove the first electrically conductive material within the recess and define a wiring pattern including the first and second electrically conductive materials. According to further aspects of these embodiments, the step of filling the contact hole and the recess with a first electrically conductive material includes depositing a first electrically conductive layer that extends into the first contact hole and into the first recess, on the electrically insulating layer and then planarizing the first electrically conductive layer for a sufficient duration to expose the electrically insulating layer and define an electrically conductive plug within the contact hole and a dummy metal pattern within the recess.

According to still further embodiments of the invention, methods of forming integrated circuit devices include forming a first electrically insulating layer on a semiconductor substrate and then forming a second electrically insulating layer on the first electrically insulating layer. A first contact hole is then formed. This first contact hole extends through the first and second electrically insulating layers. Thereafter, a first recess is formed in the second electrically insulating layer, at a location adjacent the first contact hole. The first contact hole and the first recess are then filled with a first electrically conductive material (e.g., tungsten). At least a portion of the first electrically conductive material within the first contact hole is then exposed by etching back a portion of the second electrically insulating layer using the first electrically conductive material within the first contact hole and within the first recess as an etching mask. The exposed portion of the first electrically conductive material is then covered with a second electrically conductive material (e.g., copper) to thereby define a wiring pattern. This wiring pattern includes the first and second electrically conductive materials.

According to further aspects of these embodiments, the step of filling the first contact hole and the first recess with a first electrically conductive material includes depositing a first electrically conductive layer that extends into the first contact hole and into the first recess, on the second electrically insulating layer. Thereafter, the first electrically conductive layer is planarized for a sufficient duration to expose the second electrically insulating layer. This planarization step includes planarizing the first electrically conductive layer for a sufficient duration to thereby define an electrically conductive plug within the first contact hole and a dummy metal pattern within the first recess.

The covering step may also be preceded by the step of removing the dummy metal pattern to expose another portion of the second electrically insulating layer. In particular, this removing step includes etching back the dummy metal pattern within the first recess and simultaneously etching back a portion of the electrically conductive plug within the first contact hole. Alternatively, the covering step may include depositing a layer of metallization (e.g., copper metallization) on the electrically conductive plug and on the dummy metal pattern and then planarizing the layer of metallization for a sufficient duration to remove the dummy metal pattern and expose another portion of the second electrically insulating layer.

According to further embodiments of the present invention, a method of forming an integrated circuit device may include forming a first electrically insulating layer on a semiconductor substrate and forming an electrically insulating dry etch stopper layer on the first electrically insulating layer. This electrically insulating dry etch stopper layer may have a higher dielectric constant relative to the first electrically insulating layer. A second electrically insulating layer is also formed on the dry etch stopper layer and a contact hole is formed that extends through the second electrically insulating layer and into the first electrically insulating layer. This second electrically insulating layer may have a lower dielectric constant relative to the dry etch stopper layer. Following this, a layer of metallization (e.g., tungsten metal) is deposited into the contact hole and onto the second electrically insulating layer. This layer of metallization is planarized for a sufficient duration to expose a surface of the second electrically insulating layer and define a metal plug in the contact hole. The exposed surface of the second electrically insulating layer is then dry etched for a sufficient duration to expose a surface of the dry etch stopper layer and a sidewall of the metal plug extending out from the dry etch stopper layer. The metal plug is then planarized using the dry etch stopper layer as a planarization stopper layer. Following this, a third electrically insulating layer may be formed on the planarized metal plug and on the dry etch stopper layer. In addition, a second contact hole may be formed that extends through the third electrically insulating layer and exposes the planarized metal plug.

In these embodiments, the step of planarizing the layer of metallization may include chemically-mechanically polishing the layer of metallization at a first polishing pad pressure level. However, to reduce any likelihood of dishing within the dry etch stopper layer, the step of planarizing the metal plug may include chemically-mechanically polishing the metal plug at a second polishing pad pressure level that is less than the first polishing pad pressure level. This planarization step will also cause the dry etch stopper layer to be sufficiently thinned to reduce an overall dielectric constant of the dry etch stopper layer and the third electrically insulating layer and possibly reduce parasitic capacitance associated with overlapping metal regions that may be electrically coupled to the metal plug.

According to further aspects of these embodiments, the step of forming an electrically insulating dry etch stopper layer on the first electrically insulating layer includes depositing an electrically insulating dry etch stopper layer having a thickness in a range from about 200 Å to about 300 Å on the first electrically insulating layer. In this case, the step of planarizing the metal plug may also include planarizing the dry etch stopper layer to a final thickness in a range from about 100 Å to about 200 Å. This dry etch stopper layer may be formed of silicon nitride, amorphous silicon carbide or SiCN, or combinations thereof.

Additional embodiments of the invention include methods of forming metal interconnect structures by forming a first electrically insulating layer on a semiconductor substrate and forming a second electrically insulating layer on the first electrically insulating layer. The second and first electrically insulating layers are selectively etched in sequence to define a contact hole therein. A first metal layer (e.g., tungsten) is then deposited. This first metal layer extends on the second electrically insulating layer and into the contact hole. The first metal layer is then patterned to expose the second electrically insulating layer. The second electrically insulating layer is selectively etched for a sufficient duration to expose the first electrically insulating layer and expose a metal plug within the contact hole. This selective etching step is performed using the patterned first metal layer as an etching mask. A seam within the exposed metal plug is then filled with an electrically conductive filler material. A second metal layer is formed on the exposed metal plug containing the electrically conductive filler material.

According to aspects of these embodiments, the filling step includes filling a seam within the exposed metal plug with CoWP. The patterning step may also include depositing an anti-reflective coating on the first metal layer and depositing a layer of photoresist on the anti-reflective coating. The layer of photoresist is then patterned. The anti-reflective coating and the first metal layer are etched in sequence using the patterned layer of photoresist as an etching mask.

Additional methods of forming a metal interconnect structure may include forming an electrically insulating layer on a substrate and selectively etching the electrically insulating layer to define a contact hole therein. A first metal layer is deposited into the contact hole to define a metal plug therein. The electrically insulating layer is then etched back to expose the metal plug. A seam within the exposed metal plug is filled with an electrically conductive filler material and then a second metal layer (e.g., copper layer) is formed on the exposed metal plug. This second metal layer may be planarized to define a metal interconnect comprising the metal plug. The step of forming a second metal layer may be preceded by a step of depositing a barrier metal layer on the exposed metal plug. This barrier metal layer may be a tantalum and/or tantalum nitride layer.

BRIEF DESCRIPTION OF THE DRAWINGS

FIGS. 2A-2G are cross-sectional views of intermediate structures that illustrate methods of forming metal interconnect layers according to embodiments of the present invention.

FIGS. 3A-3B are cross-sectional views of intermediate structures that illustrate alternative process steps to those illustrated by FIGS. 2F-2G, according to embodiments of the present invention.

FIGS. 4A-4E are cross-sectional views of intermediate structures that illustrate methods of forming metal interconnect structures according to embodiments of the present invention.

FIGS. 5A-5J are cross-sectional view of intermediate structures that illustrate methods of forming metal interconnect structures according to additional embodiments of the present invention.

DETAILED DESCRIPTION OF PREFERRED EMBODIMENTS

Figure 1A:
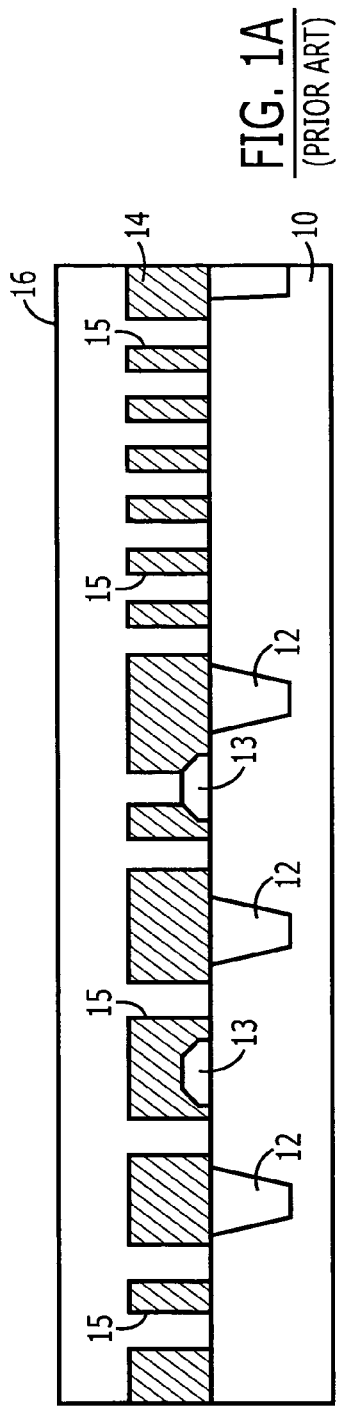
FIGS. 1A-1C are cross-sectional views of intermediate structures that illustrate conventional methods of forming metal interconnect layers using damascene process steps.
Figure 1B:
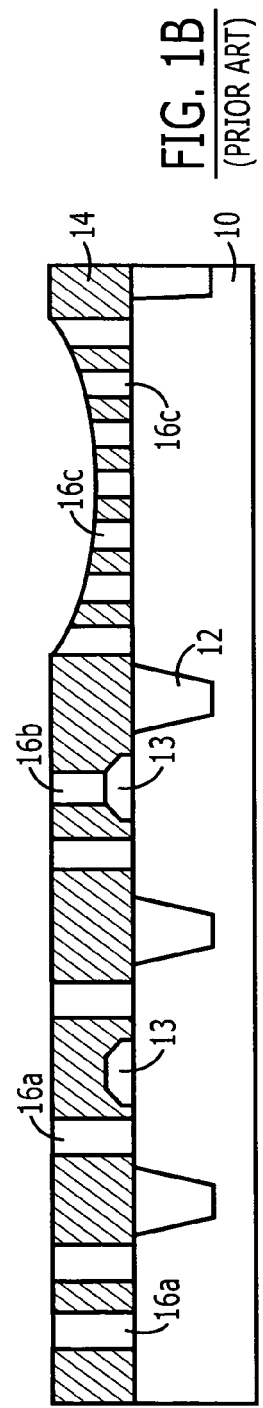
Figure 1C:
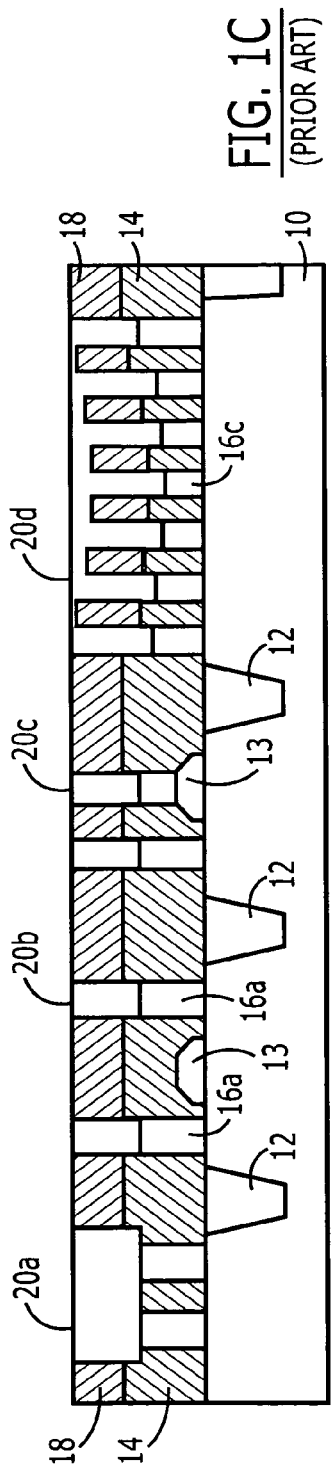

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Referring now to FIG. 2A, methods of forming metal interconnect layers according to some embodiments of the invention include steps to form a first electrically insulating layer 114 on a semiconductor substrate 110. As illustrated, the semiconductor substrate 110 may be an integrated circuit substrate having a plurality of trench isolation regions 112 therein and a plurality of device structures 113 (e.g., gate electrodes) thereon. This first electrically insulating layer 114 may be a silicon dioxide layer having a thickness in a range from about 2,000 Å to about 4,000 Å, however, a layer 114 having a thickness less than 2,000 Å or greater than 4,000 Å is also possible. The first electrically insulating layer 114 is then covered with a second electrically insulating layer 118. This second electrically insulating layer 118 may be formed by depositing an electrically insulating material having a relatively low dielectric constant, such as SiCOH or SiLK™, which is an aromatic hydrocarbon polymer having a dielectric constant of about 2.65. The second electrically insulating layer 118 may be formed to have a thickness in a range from about 1,500 Å to about 2,000 Å, however, other thicknesses are also possible. The first and second electrically insulating layers 114 and 118, respectively, are then patterned to define a plurality of contact holes 117 therein. These contact holes 117, which may be etched using a photolithographically defined mask (not shown), may extend completely through the first electrically insulating 114 and expose an upper surface of the semiconductor substrate 110 and/or one or more of the device structures 113.

Referring now to FIG. 2B, a spin-on-glass (SOG) layer 120 is conformally applied to thereby fill the plurality of contact holes 117 and uniformly coat an upper surface of the second electrically insulating layer 118. As will be understood by those skilled in the art, the SOG layer 120 may be used to achieve a high degree of surface planarity so that high precision photolithography steps may be subsequently performed. These high precision photolithography steps may include the sequential deposition of a low temperature oxide (LTO) layer 122 and an anti-reflective coating 124. Thereafter, a layer of photoresist may be deposited and patterned to define a reverse-image photoresist mask 126. This mask 126 may be configured to have openings therein that extend opposite upper surface portions of the second electrically insulating layer 118, which are closely adjacent the contact holes 117.

Figure 2C:
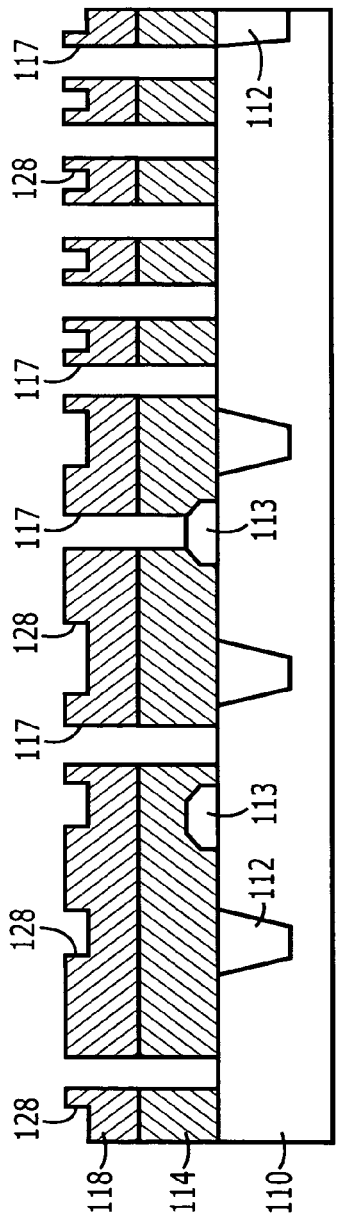
Figure 2D:
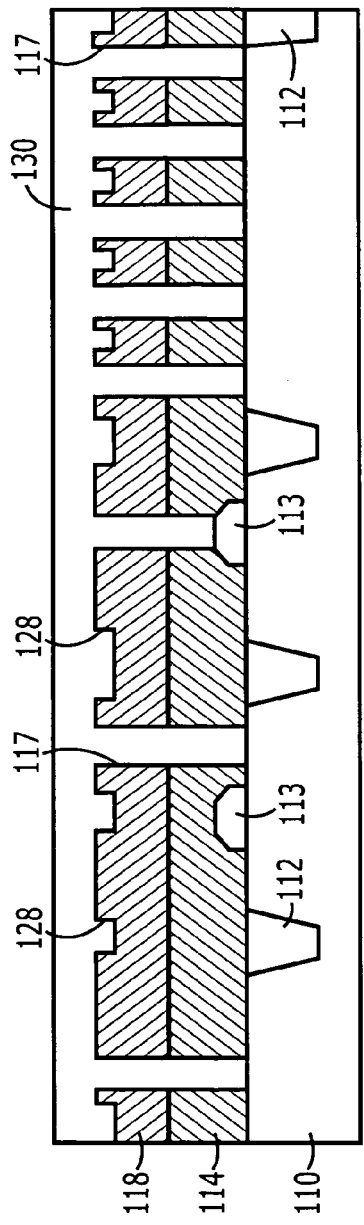
Figure 2E:
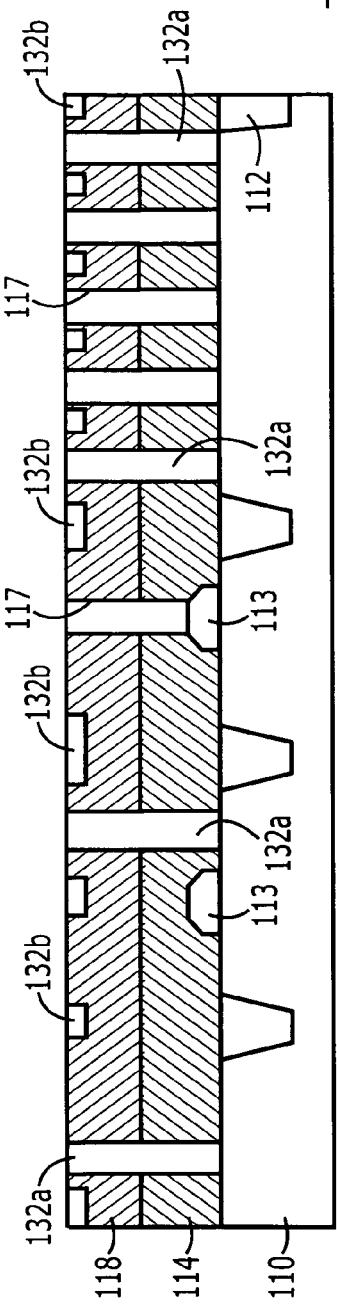

As illustrated by FIG. 2C, an etching step(s) (e.g., reactive ion etching (RIE)) may then be performed to selectively etch through the anti-reflective coating 124, the low temperature oxide layer 122, the SOG layer 120 and the upper surface of the second electrically insulating layer 118, in sequence, to define a plurality of recesses 128 within the upper surface of the second electrically insulating layer 118. These recesses 128 may have a depth of about 500-1000 Å. Referring now to FIGS. 2D-2E, the contact holes 117 and recesses 128 are then filled with a first electrically conductive material. In particular, a blanket layer of metal 130 (e.g., tungsten (W)) may be conformally deposited onto the second electrically insulating layer 118 and into the contact holes 117. This blanket layer of metal 130 may have a thickness in a range from about 1000 Å to about 5000 Å. The blanket layer of metal 130 is then planarized by chemically-mechanically polishing the blanket layer of metal 130 for a sufficient duration to expose the upper surface of the second electrically insulating layer 118 and thereby define a plurality of electrically conductive plugs 132a within the contact holes 117 and a plurality of dummy metal patterns 132b within the plurality of recesses 128.

Figure 2F:
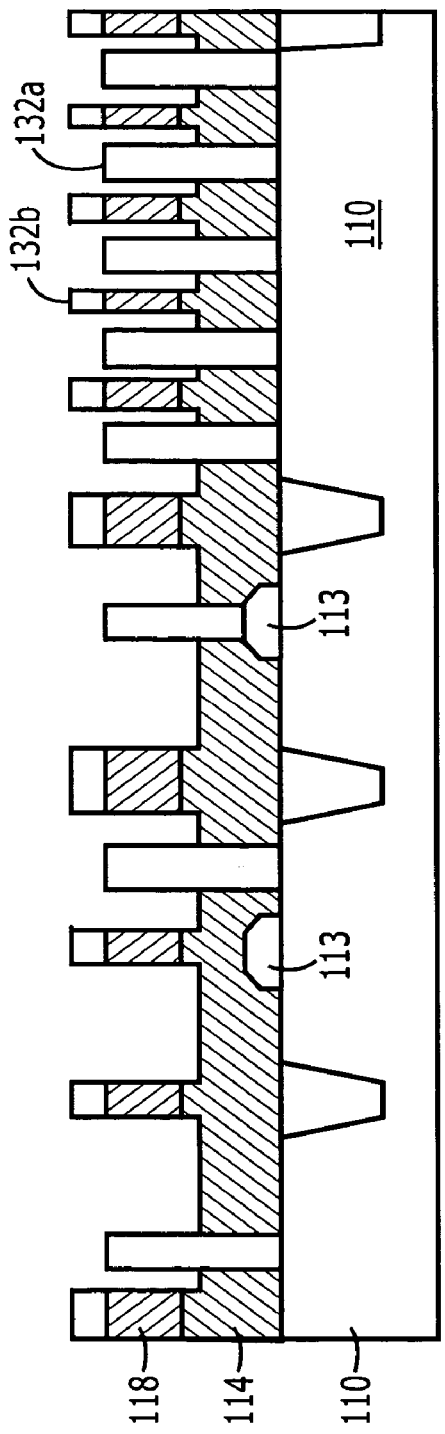
Figure 2G:
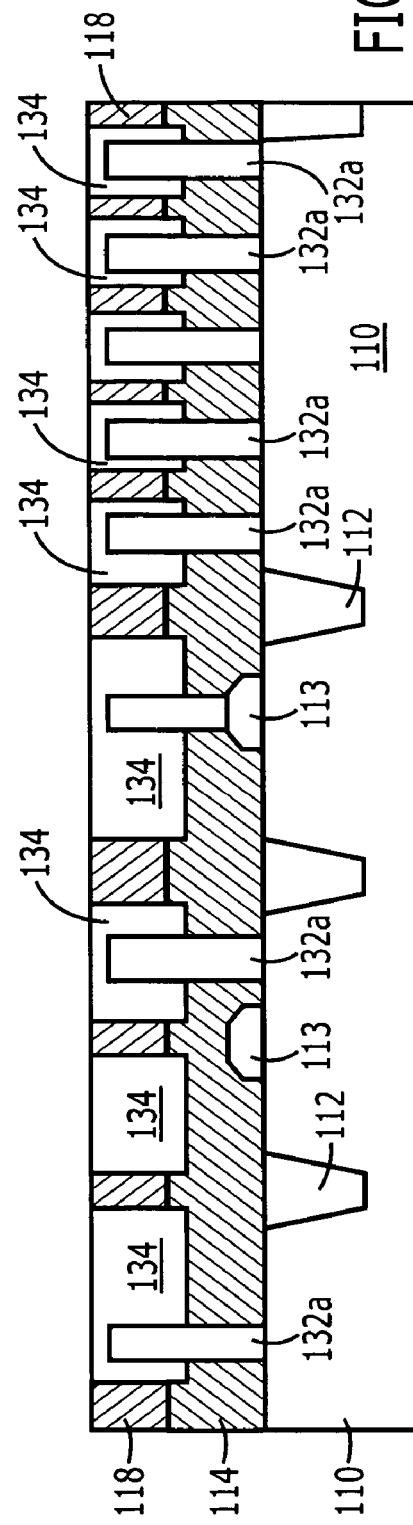

Referring now to FIG. 2F, a reactive ion etching (RIE) step is performed to directionally etch back exposed portions of the second electrically insulating layer 118, using the electrically conductive plugs 132a and the dummy metal patterns 132b as an etching mask. As illustrated, this RIE step may be performed for a sufficient duration to expose (and possibly etch back) an upper surface of the first electrically insulating layer 114. Thereafter, as illustrated by FIG. 2G, a second blanket layer of a metal (e.g., copper (Cu)) is deposited on the resulting structure of FIG. 2F and then planarized (e.g., using chemical-mechanical polishing) for a sufficient duration to remove the dummy metal patterns 132b and expose underlying portions of the second electrically insulating layer 118. The second blanket layer of metal may have a thickness in a range from about 4000 Å to about 9000 Å. The resulting regions of the second electrically insulating layer 118 that extend between adjacent conductive plugs 132a operate to electrically isolate adjacent metal wiring patterns from each other. Each of these wiring patterns includes a respective conductive plug 132a with a covering metal pattern 134 (e.g., copper cap) derived from the second layer of metal. Subsequent process and packaging steps (not shown) may then be performed to complete an integrated circuit device having one or more layers of metallization formed from the process steps described herein.

According to additional embodiments of the invention, the steps illustrated and described above with respect to FIGS. 2F-2G may be replaced by the steps of FIGS. 3A-3B. In particular, FIG. 3A illustrates the performance of a reactive ion etching (RIE) step to directionally etch back exposed portions of the second electrically insulating layer 118, using the electrically conductive plugs 132a and the dummy metal patterns 132b as an etching mask. As illustrated, this RIE step may be performed for a sufficient duration to expose (and possibly etch back) an upper surface of the first electrically insulating layer 114. Thereafter, an additional etching step (wet or dry etch) is performed to etch back (i.e., shorten) the conductive plugs 132a and remove the dummy metal patterns 132b. Then, as illustrated by FIG. 3B, a second blanket layer of a metal (e.g., copper (Cu)) is deposited on the resulting structure of FIG. 3A and then planarized (e.g., using chemical-mechanical polishing) for a sufficient duration to expose underlying portions of the second electrically insulating layer 118. The resulting regions of the second electrically insulating layer 118 that extend between adjacent conductive plugs 132a operate to electrically isolate adjacent metal wiring patterns from each other. Each of these wiring patterns includes a respective conductive plug 132a with a covering metal pattern 134 (e.g., copper cap) derived from the second layer of metal.

Figure 4A:
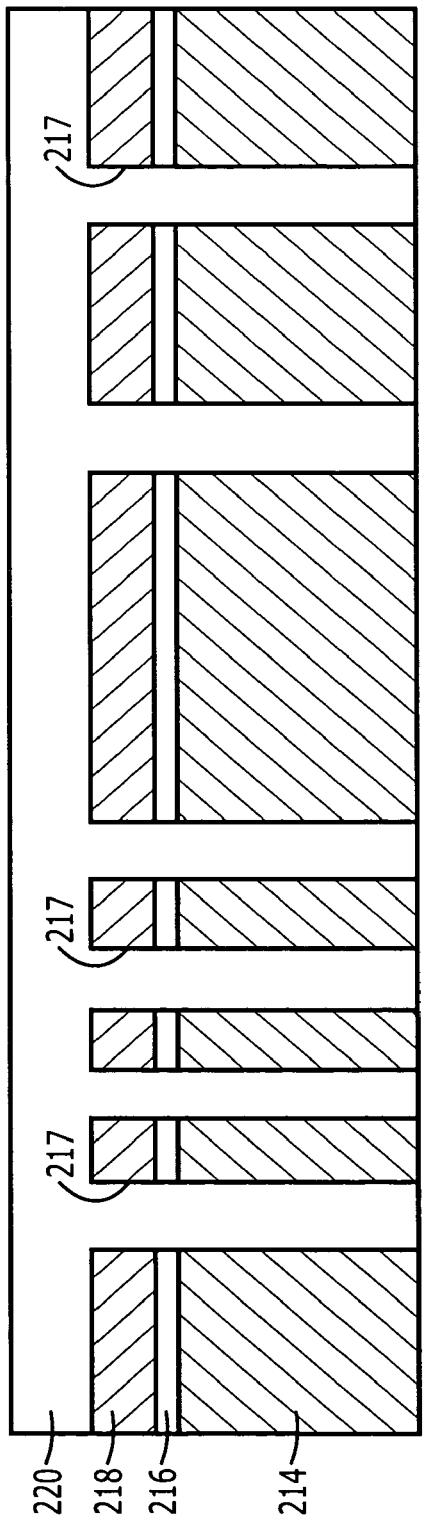

Further embodiments of the invention include methods of forming metal interconnect structures on semiconductor substrates. These metal interconnect structures include the metal plugs illustrated by FIGS. 4A-4E. In particular, FIG. 4A illustrates the steps of forming a first electrically insulating layer 214 and then forming an electrically insulating dry etch stopper layer 216 on the first electrically insulating layer. A second electrically insulating layer 218 is also formed on the dry etch stopper layer 216. The first and second electrically insulating layers 214 and 218, which may include the same or different materials, may be formed as undoped silicate glass (USG) or borophosphosilicate glass (BPSG) layers, for example. These insulating layers may be formed using high density plasma (HDP), plasma enhanced CVD (PECVD), or semi-atmospheric CVD (SACVD) techniques, for example. Moreover, the first electrically insulating layer 214 may be formed on a semiconductor substrate, such as the substrate 110 illustrated by FIGS. 2A-2G. A plurality of contact holes 217 are then formed. These contact holes 217 extend through the second electrically insulating layer 218 and into the first electrically insulating layer 214, as illustrated. Thereafter, a blanket layer of metallization 220 (e.g., tungsten metal) is conformally deposited onto the second electrically insulating layer 218 and into the contact holes 217.

Figure 4B:
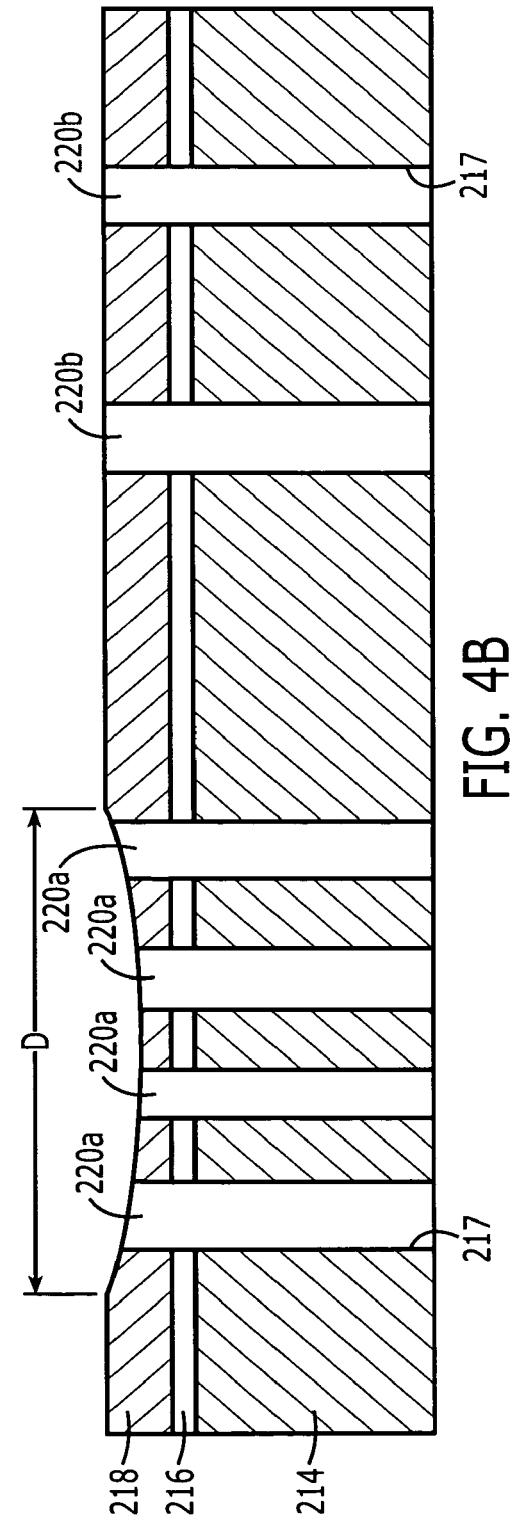

Referring now to FIG. 4B, this layer of metallization 220 is then planarized for a sufficient duration to expose an upper surface of the second electrically insulating layer 218 and define a plurality of metal plugs (220a, 220b) in the contact holes 217. As illustrated, if a density of metal plugs is sufficiently high, the planarization of the layer of metallization 220 may result in "dishing" (D) within the second electrically insulating layer 218. Thereafter, as illustrated by FIG. 4C, the exposed surface of the second electrically insulating layer 218 is dry etched for a sufficient duration to expose a surface of the dry etch stopper layer 216 and sidewalls of the metal plugs (220a, 220b) extending out from the dry etch stopper layer 216.

Figure 4E:
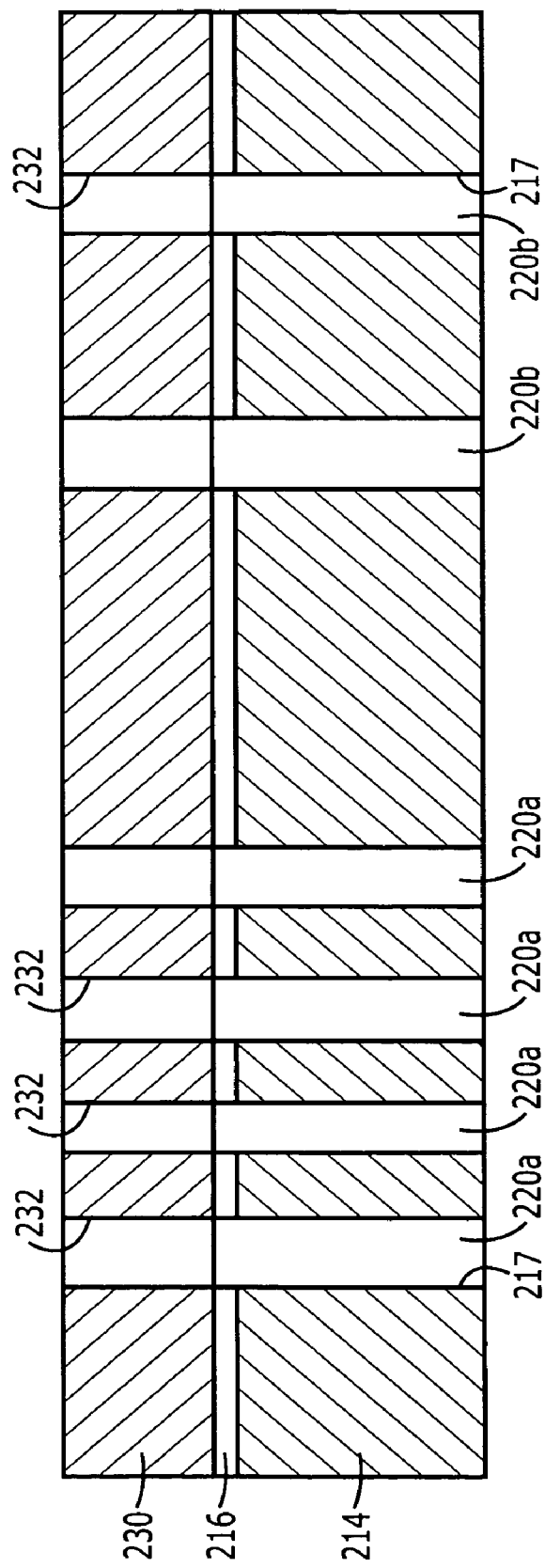

The metal plugs 220a, 220b are then planarized and the dry etch stopper layer 216 is used as a planarization stopper layer, as illustrated by FIG. 4D. Thereafter, as illustrated by FIG. 4E, a third electrically insulating layer 230 is deposited on the planarized metal plugs 220a, 220b and on the dry etch stopper layer 216. This third electrically insulating layer 230 may be photolithographically patterned to define a plurality of contact holes 232 therein, which may expose corresponding underlying metal plugs 220a, 220b.

According to preferred aspects of the embodiments illustrated by FIGS. 4A-4E, the step of planarizing the layer of metallization 220 includes chemically-mechanically polishing the layer of metallization 220 at a first polishing pad pressure level and the step of planarizing the metal plugs 220a, 220b includes chemically-mechanically polishing the metal plugs (220a, 220b) at a second polishing pad pressure level that is less than the first polishing pad pressure level. In particular, the step of chemically-mechanically polishing the layer of metallization 220 at a first polishing pad pressure level may include polishing the layer of metallization 220 at a pad pressure of about 3 psi and pad rotating speed in a range from about 20 to about 100 rpms, using an abrasive slurry comprising SiO2. In addition, the step of chemically-mechanically polishing the metal plugs at a second polishing pad pressure level may include polishing the metal plugs at a pad pressure of about 1 psi and pad rotating speed in a range from about 20 to about 100 rpms, using an abrasive slurry comprising SiO2.

This latter "gentle" planarization of the metal plugs may also cause the dry etch stopper layer 216 to be sufficiently thinned (without significant dishing) to thereby reduce an overall dielectric constant of the combination of the dry etch stopper layer 216 and the third electrically insulating layer 230 and possibly reduce parasitic capacitance associated with overlapping metal regions that may be electrically coupled to the metal plugs 220a, 220b.

Moreover, in some additional embodiments of the invention, the step of forming the electrically insulating dry etch stopper layer 216 includes depositing an electrically insulating dry etch stopper layer 216 having a thickness in a range from about 200 Å to about 300 Å on the first electrically insulating layer 214. In this case, the step of planarizing the metal plugs 220a, 220b may include planarizing the dry etch stopper layer to a thickness in a range from about 100 Å to about 200 Å to thereby reduce parasitic capacitance. In still further embodiments of the invention, the step of forming an electrically insulating dry etch stopper layer 216 includes depositing a layer of silicon nitride, amorphous silicon carbide or SiCN, or combinations thereof, on the first electrically insulating layer 214.

Referring now to FIGS. 5A-5J, additional methods of forming metal interconnect structures include forming first and second electrically insulating layers 310, 312 on a primary surface of a substrate 300, which is shown as a semiconductor substrate. The first electrically insulating layer 310 may be formed as a silicon dioxide layer ($SiO_2$) having an initial thickness of about 6,000 Å and may then be polished to a thickness of about 3,500 Å to remove surface unevenness. The second electrically insulating layer 312 may be formed as a carbon-doped silicon oxide layer (SiOC) having a thickness of about 1,350 Å, for example. In alternative embodiments, the first electrically insulating layer 310 may be formed as an undoped silicate glass (USG) layer or a borophosphosilicate glass (BPSG) layer, which is deposited using a HDP (high density plasma) step, a plasma enhanced chemical vapor deposition (PECVD) step or a semi-atmospheric chemical vapor deposition (SACVD) step. The second electrically insulating layer 312 may also be formed as a fluorine doped silica glass (FSG) layer. In still further embodiments, the first and second electrically insulating layers may be formed of the same material.

Figure 5C:
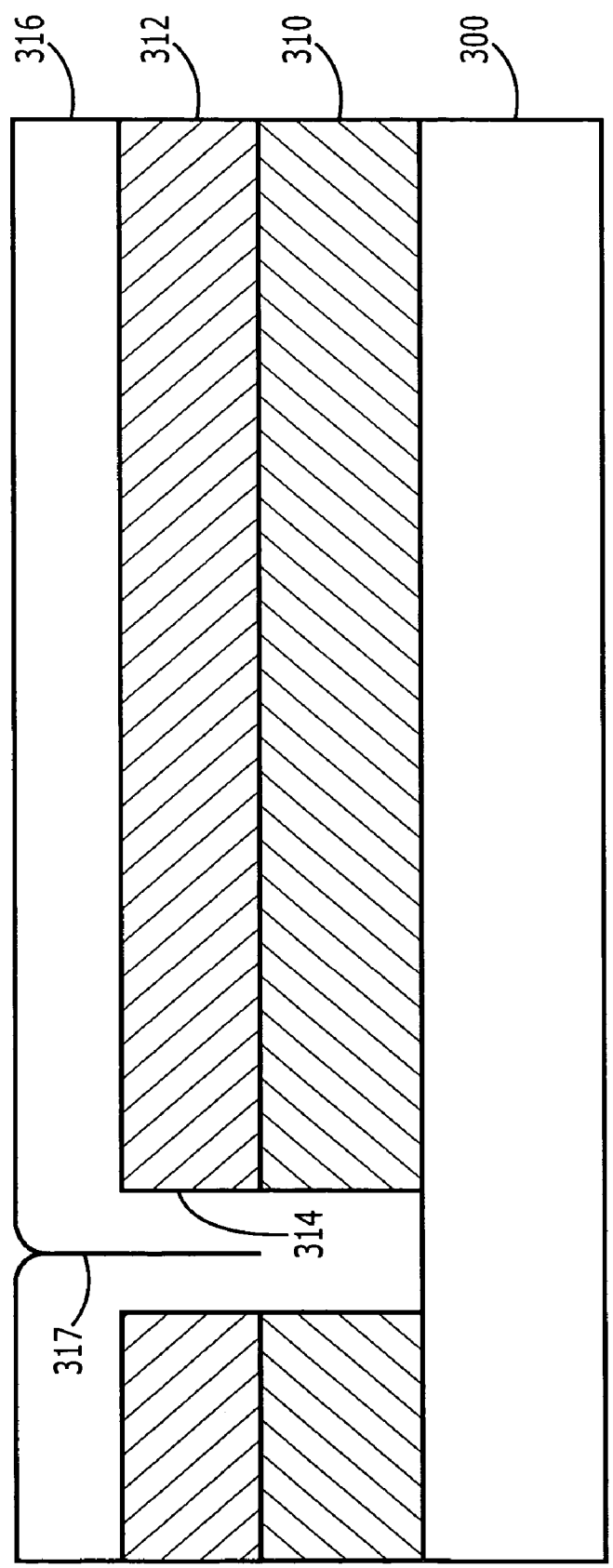

As illustrated by FIG. 5B, the first and second electrically insulating layers 310, 312 may be photolithographically patterned to define a contact hole 314 therein. In some embodiments of the invention, the contact hole 314 may expose the primary surface of the substrate 300. In other embodiments, the contact hole may extend only partially through the first electrically insulating layer 310. Thereafter, a first layer of metal 316 is deposited onto the second electrically insulating layer 312 and into the contact hole 314, as illustrated by FIG. 5C. This first layer of metal 316 may be a layer of tungsten (W) having a thickness of about 2,500 Å. In some cases, a conformal deposition of the first layer of metal 316 may result in the formation of a metal seam 317 that extends vertically into the contact hole 314.

Figure 5D:
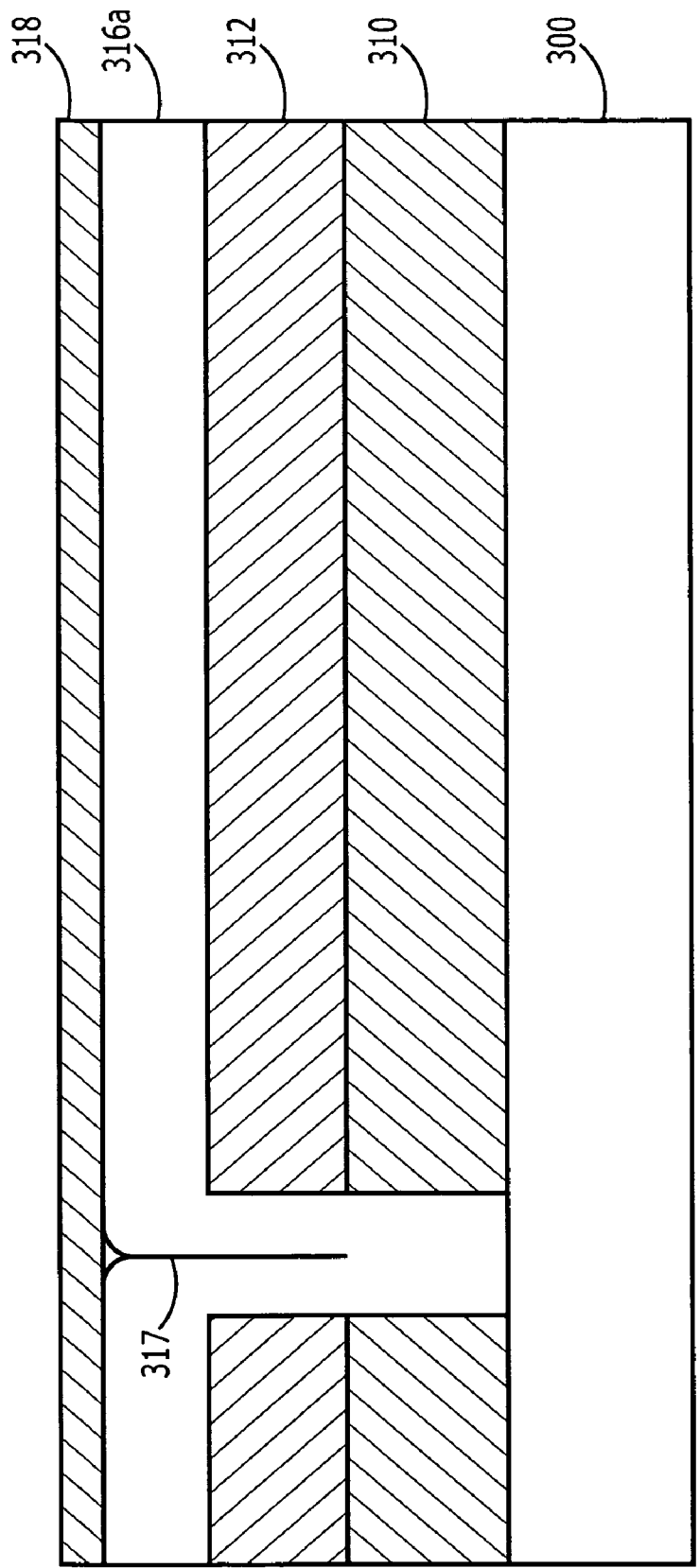
Figure 5E:
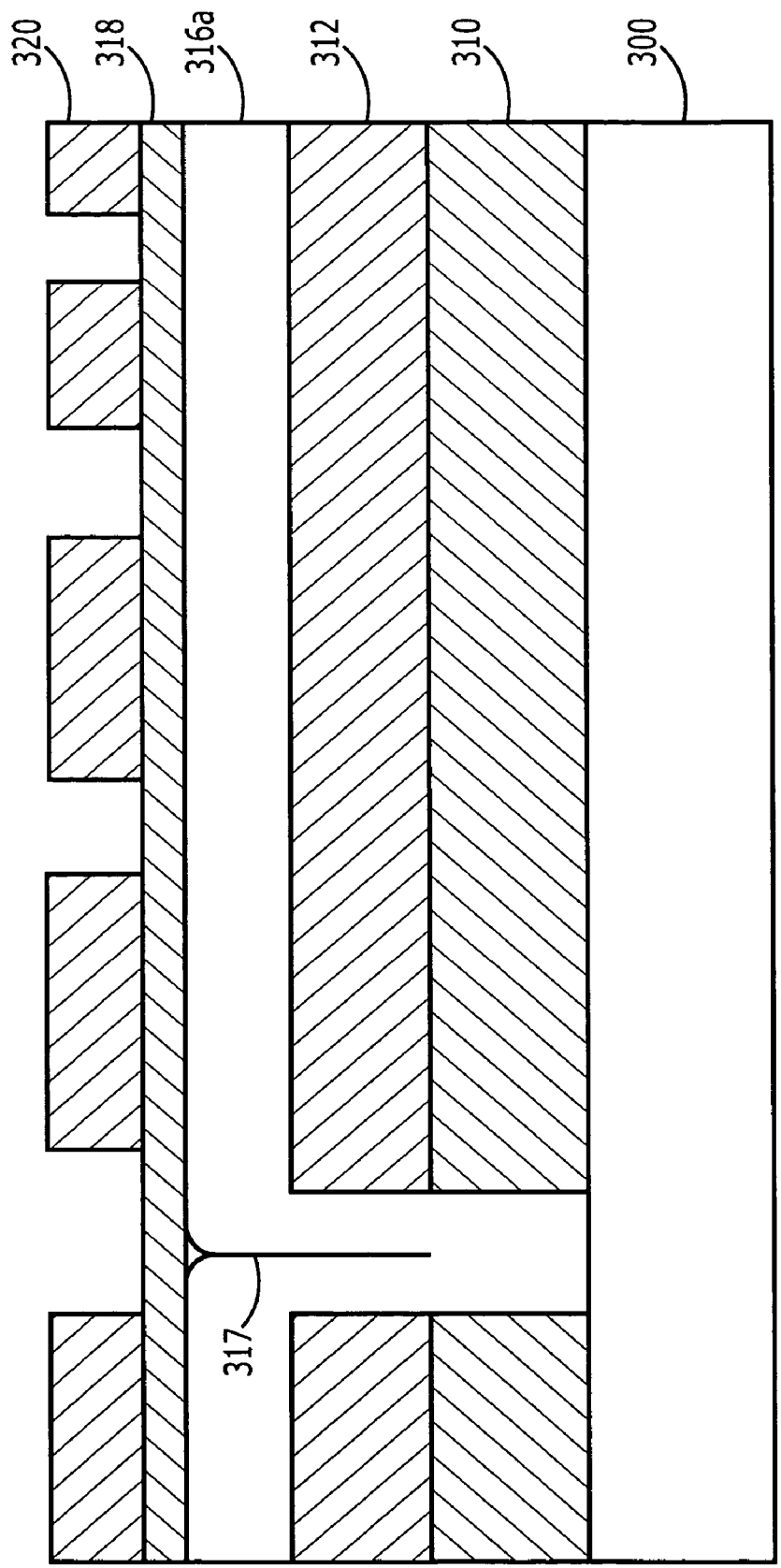
Figure 5F:
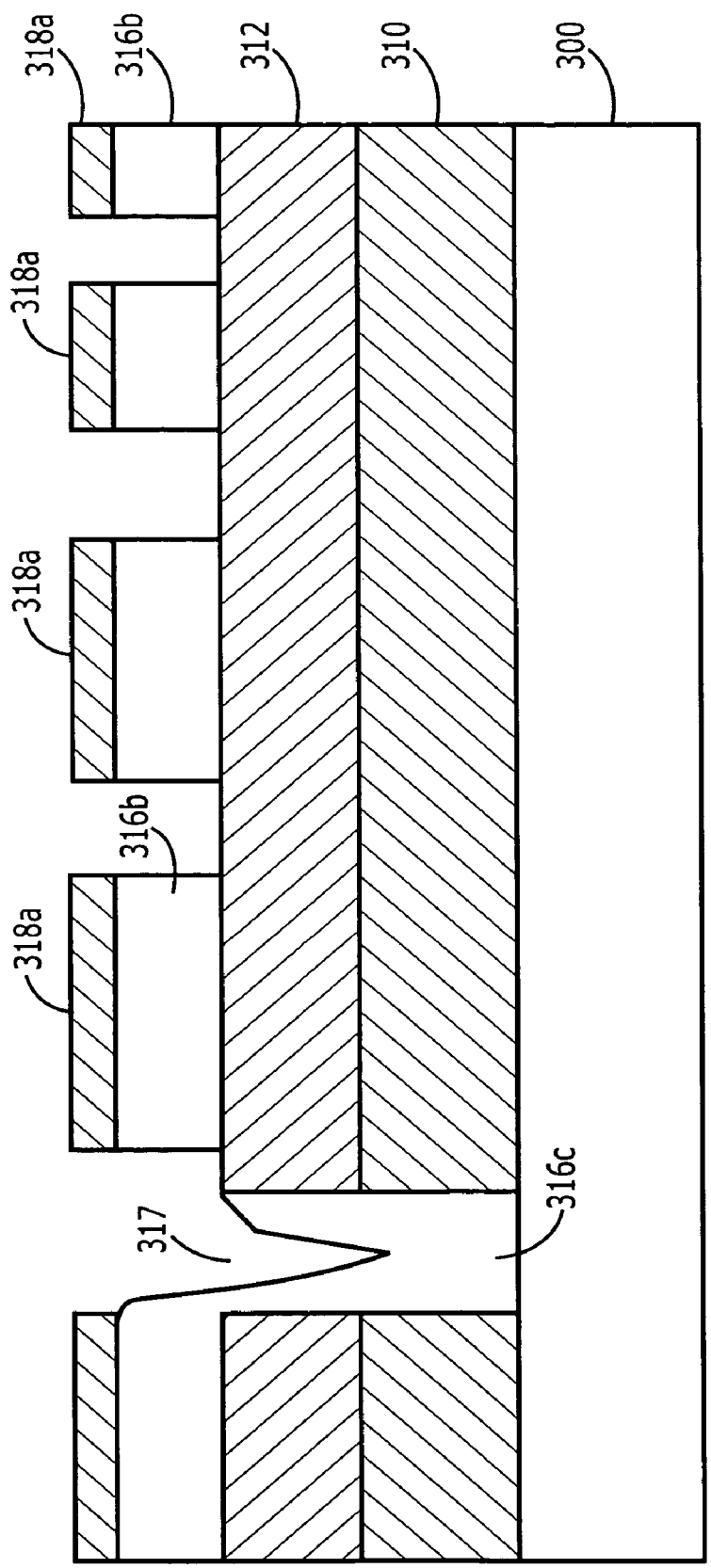

Referring now to FIG. 5D, the first layer of metal 316 is then planarized to define a metal layer 316a having a smooth primary surface. This step of planarizing the first layer of metal 316 may include etching back the first layer of metal 316 using a reactive ion etching (RIE) technique, for example, or chemically-mechanically polishing the first layer of metal 316. Thereafter, an anti-reflective coating 318 may be formed on the metal layer 316a. This anti-reflective coating 318 may be formed as a silicon oxynitride (SiON) layer having a thickness of about 1,000 Å. This anti-reflective coating 318, which is optional, supports the accurate photolithographic definition of a patterned photoresist layer 320, as illustrated by FIG. 5E. This patterned photoresist layer 320 is used as an etching mask during a step to selectively etch back the anti-reflective coating 318 and the metal layer 316a. As illustrated by FIG. 5F, the selective etching of the anti-reflective coating 318 and the metal layer 316a results in the formation of a patterned anti-reflective coating 318a and a patterned metal layer. This patterned metal layer includes metal regions 316b and a metal plug 316c. The selective etching of the metal layer 316a may also cause a widening of the seam 317.

Figure 5G:
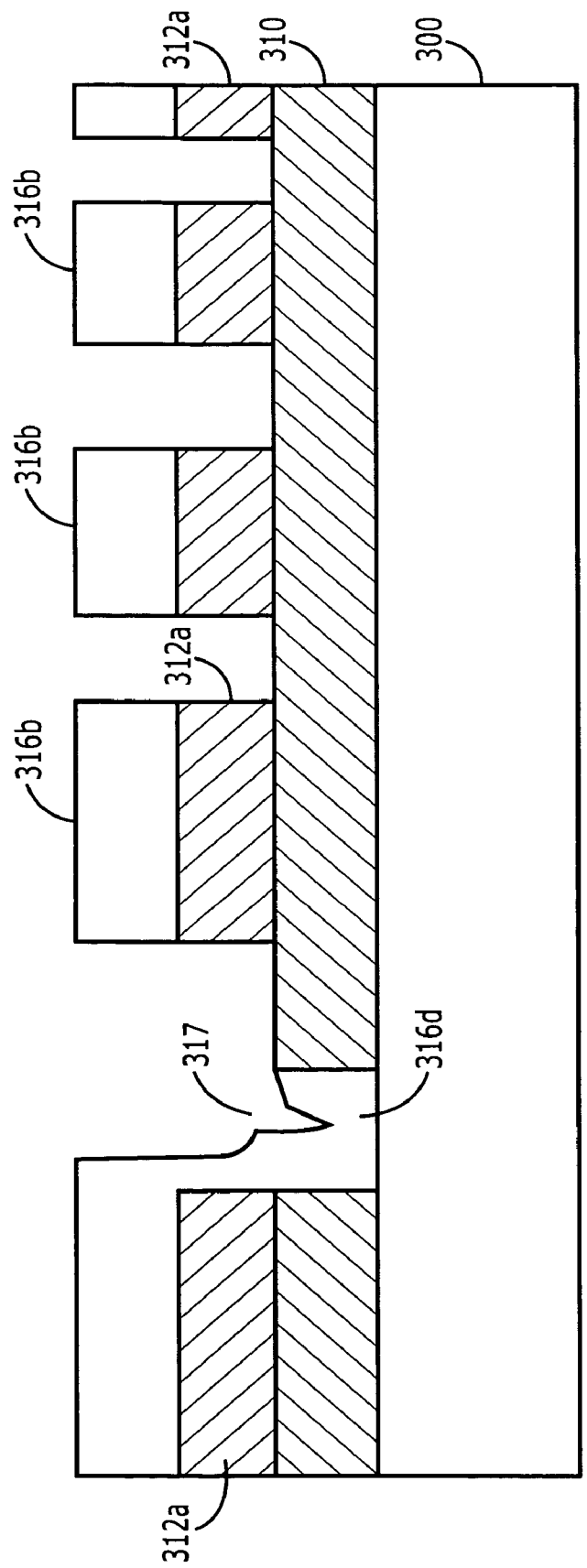
Figure 5H:
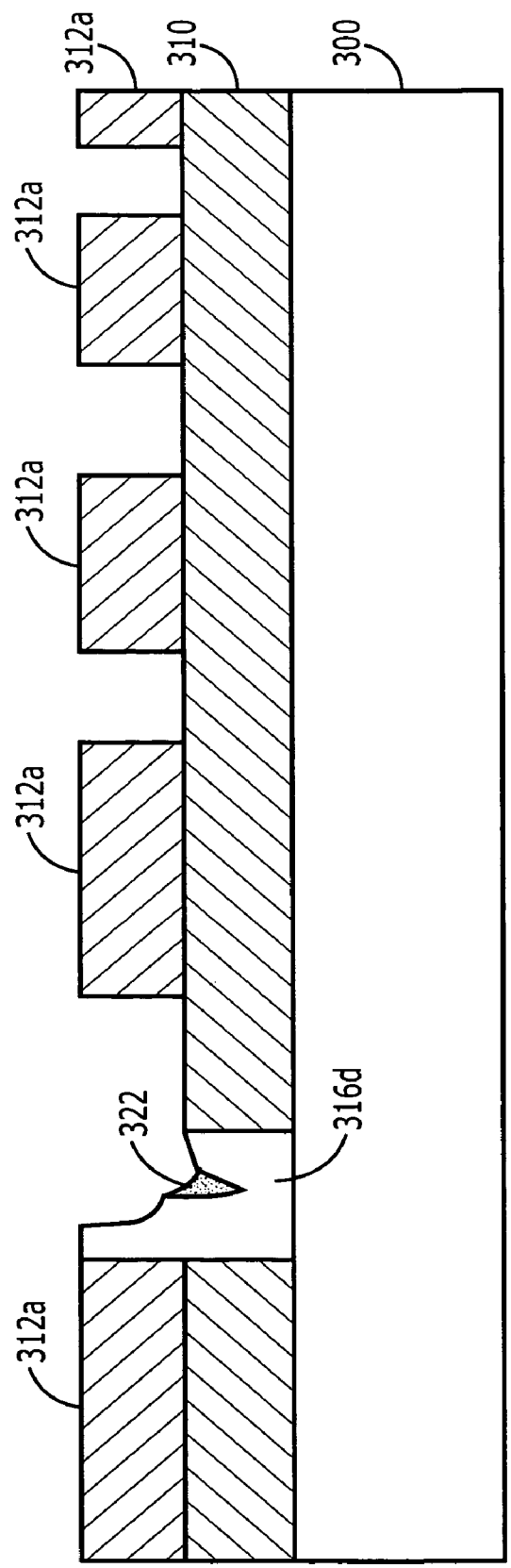
Figure 5I:
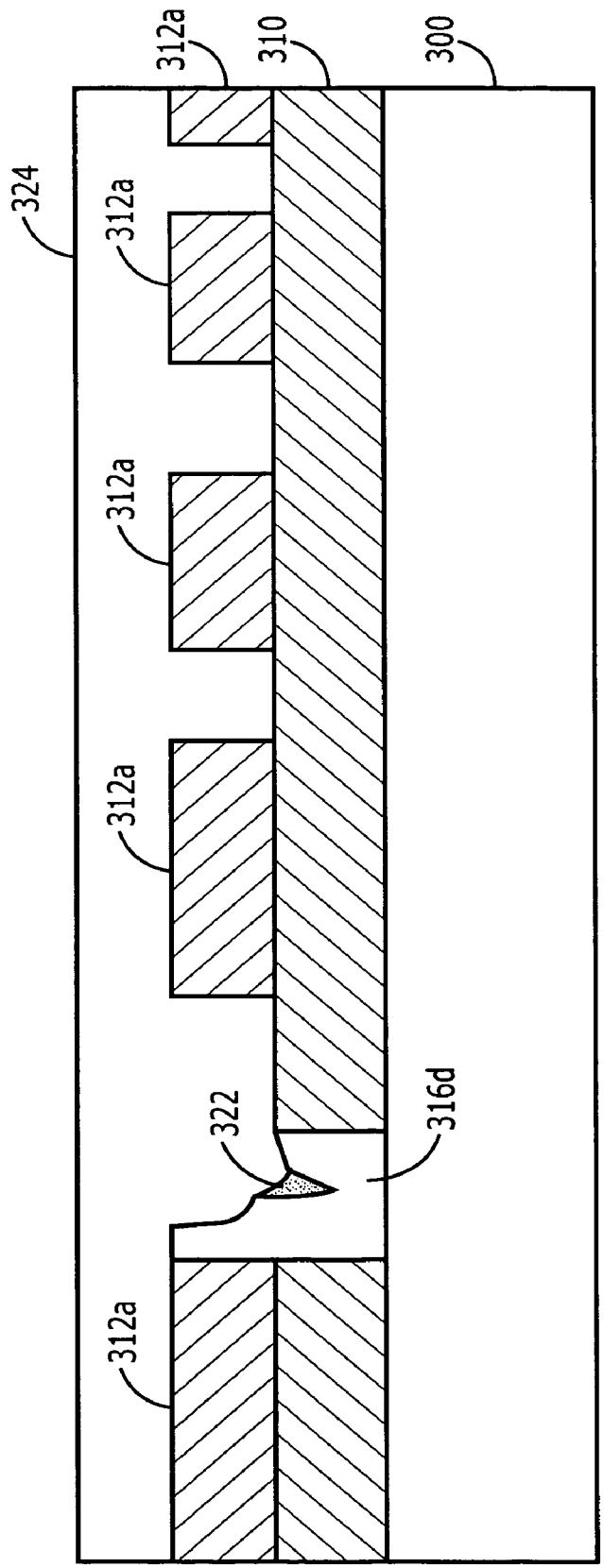
Figure 5J:
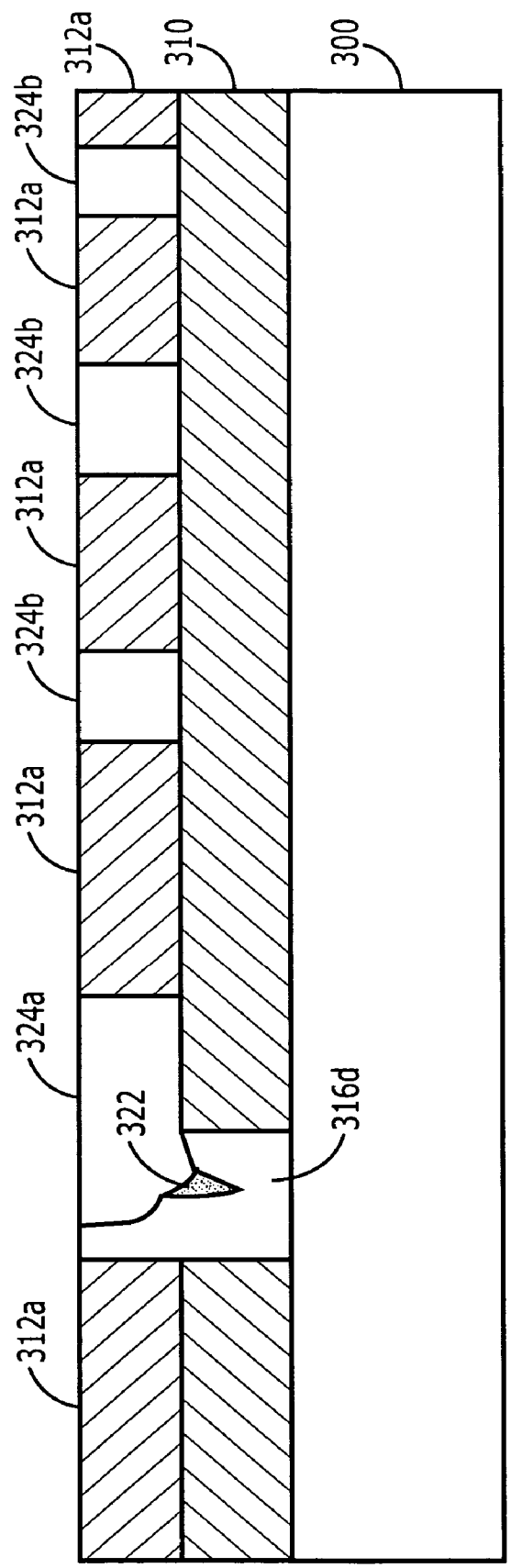

Referring now to FIG. 5G, the second electrically insulating layer 312 (and patterned anti-reflective coating 318a) is selectively etched back for a sufficient duration to expose portions of the first electrically insulating layer 310 and define a patterned second electrically insulating layer 312a. During this etching step, the patterned metal regions 316b collectively form a hard etching mask. As illustrated by FIG. 5H, the remaining metal hard mask 316b may be etched back to expose the second electrically insulating layer 312a. The metal plug 316c may be further etched to define a metal plug 316d having an exposed seam 317 therein. This exposed seam 317 is then filled with an electrically conductive filler material 322. This filler material 322 may be added to the exposed seam 317 by selectively depositing a layer of CoWP. After the exposed seam 317 has been filled with an electrically conductive filler material 322, a blanket metal barrier layer (not shown) may be deposited onto the structure of FIG. 5H. This metal barrier layer may be formed as a tantalum layer, a tantalum nitride layer or a bilayer including tantalum and tantalum nitride, for example. Referring now to FIG. 5I, a second metal layer 324 is deposited on the metal plug 316d and the patterned second electrically insulating layer 312a. This second metal layer 324, which may be formed by electroplating, may be a copper layer having a thickness of about 6,000 Å. Referring now to FIG. 5J, the second metal layer 324 is then planarized for a sufficient duration to expose the patterned second electrically insulating layer 312a and define a plurality of conductive wiring patterns 324a and 324b. The wiring pattern 324a is formed in direct contact with the metal plug 316d and electrically conductive filler material 322.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a metal interconnect structure, comprising the steps of:
   forming a first electrically insulating layer on a semiconductor substrate;
   forming a second electrically insulating layer on the first electrically insulating layer;
   selectively etching the second and first electrically insulating layers in sequence to define a contact hole therein;
   depositing a first metal layer that extends on the second electrically insulating layer and into the contact hole;
   patterning the first metal layer to expose the second electrically insulating layer;
   selectively etching the second electrically insulating layer for a sufficient duration to expose the first electrically insulating layer and expose a metal plug within the contact hole, using the patterned first metal layer as an etching mask;
   filling a seam within the exposed metal plug with an electrically conductive filler material; and
   forming a second metal layer on the exposed metal plug containing the electrically conductive filler material.

2. The method of claim 1, wherein said filling step comprises filling a seam within the exposed metal plug with CoWP.

3. The method of claim 1, wherein said patterning step comprises the steps of:
   depositing an anti-reflective coating on the first metal layer;
   depositing a layer of photoresist on the anti-reflective coating;
   patterning the layer of photoresist; and
   etching the anti-reflective coating and first metal layer in sequence using the patterned layer of photoresist as an etching mask.

4. The method of claim 1, wherein said step of forming a second metal layer is followed by a step of planarizing the second metal layer for a sufficient duration to expose the second electrically insulating layer.

5. The method of claim 1, wherein said step of forming a second metal layer comprises electroplating a layer of copper onto the exposed metal plug.

6. A method of forming a metal interconnect structure, comprising the steps of:
   forming an electrically insulating layer on a substrate;
   selectively etching the electrically insulating layer to define a contact hole therein;
   depositing a first metal layer into the contact hole to define a metal plug having a seam therein;
   selectively etching back the metal plug for a sufficient duration to expose an upper surface of the electrically insulating layer;
   etching back the electrically insulating layer using the metal plug as a hard etching mask; then
   etching back the metal plug to widen the seam therein; then
   filling the seam within the exposed metal plug with an electrically conductive filler material; and
   forming a second metal layer on the exposed metal plug.

7. The method of claim 6, wherein said step of forming a second metal layer is followed by a step of planarizing the second metal layer to define a metal interconnect comprising the metal plug.

8. The method of claim 6, wherein the first metal layer is tungsten; and wherein the second metal layer is copper.

9. The method of claim 6, wherein the electrically conductive filler material comprises CoWP.

10. The method of claim 6, wherein forming a second metal layer comprises electroplating the second metal layer onto the exposed metal plug.

11. The method of claim 6, wherein said step of forming a second metal layer is preceded by a step of depositing a barrier metal layer comprising tantalum and/or tantalum nitride on the exposed metal plug.

12. A method of forming a metal interconnect structure, comprising the steps of:
 forming a first electrically insulating layer on a semiconductor substrate;
 forming a second electrically insulating layer on the first electrically insulating layer;
 selectively etching the first and second electrically insulating layers in sequence to define a contact hole extending through the second electrically insulating and into the first electrically insulating layer;
 depositing a layer of tungsten that extends on the second electrically insulating layer and into the contact hole;
 patterning the layer of tungsten to define a hard mask;
 selecting etching the second electrically insulating layer to expose a tungsten plug within the contact hole, using the hard mask as an etching mask;
 filling a seam within the tungsten plug with CoWP; and
 forming a copper wiring pattern that contacts the tungsten plug.

13. The method of claim 12, wherein said step of forming a copper wiring pattern comprises the steps of:
 electroplating a layer of copper onto the tungsten plug; and
 chemically-mechanically polishing the layer of copper.

14. The method of claim 13, wherein said step of patterning the layer of tungsten is preceded by the step of chemically-mechanically polishing the layer of tungsten.

15. The method of claim 12, wherein said step of patterning the layer of tungsten is preceded by a step of chemically-mechanically polishing the layer of tungsten.

16. A method of forming a metal interconnect structure, comprising the steps of:
 forming at least one electrically insulating layer on a semiconductor substrate;
 selectively etching the at least one electrically insulating layer to define a contact hole therein;
 forming a tungsten plug having a seam therein in the contact hole;
 selectively etching back the tungsten plug for a sufficient duration to expose an upper surface of the at least one electrically insulating layer;
 selecting etching the at least one electrically insulating layer using the tungsten plug as a hard etching mask; then
 etching back the metal plug to widen the seam therein; then
 filling the seam within the tungsten plug with CoWP; and
 forming a copper wiring pattern on the tungsten plug containing the filled seam.

* * * * *